United States Patent
Hohlfeld et al.

(10) Patent No.: US 9,595,502 B2
(45) Date of Patent: Mar. 14, 2017

(54) SPRING CONTACT FOR SEMICONDUCTOR CHIP

(71) Applicant: Infineon Technologies AG, Neubiberg (DE)

(72) Inventors: Olaf Hohlfeld, Warstein (DE); Edward Fuergut, Dasing (DE); Horst Groeninger, Maxhuette-Haidhof (DE); Juergen Hoegerl, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/926,258

(22) Filed: Oct. 29, 2015

(65) Prior Publication Data

US 2016/0126211 A1 May 5, 2016

(30) Foreign Application Priority Data

Oct. 30, 2014 (DE) .......... 10 2014 222 189

(51) Int. Cl.

| H01L 23/48 | (2006.01) |
| H01L 23/00 | (2006.01) |
| H01L 23/433 | (2006.01) |
| H01L 29/739 | (2006.01) |
| H01L 23/31 | (2006.01) |
| H01L 21/56 | (2006.01) |

(52) U.S. Cl.
CPC .......... *H01L 24/72* (2013.01); *H01L 23/3107* (2013.01); *H01L 23/433* (2013.01); *H01L 24/83* (2013.01); *H01L 29/7393* (2013.01); *H01L 21/56* (2013.01); *H01L 23/3185* (2013.01); *H01L 2924/351* (2013.01)

(58) Field of Classification Search
CPC ..... H01L 24/05; H01L 27/0248; H01L 23/60; H01L 24/83; H01L 23/3107; H01L 29/7393; H01L 21/56; H01L 23/3185; H01L 23/433

See application file for complete search history.

(56) References Cited

U.S. PATENT DOCUMENTS

| 5,866,944 A | 2/1999 | Hiyoshi et al. |
| 6,452,261 B1 | 9/2002 | Kodama et al. |
| 8,247,899 B2 | 8/2012 | Knebel et al. |
| 2010/0117219 A1* | 5/2010 | Oka .................... H01L 23/4334 257/693 |
| 2010/0201002 A1* | 8/2010 | Hiramatsu .............. H01L 23/16 257/779 |
| 2014/0262498 A1 | 9/2014 | Hester et al. |
| 2016/0126212 A1* | 5/2016 | Hohlfeld ................. H01L 24/72 327/538 |

FOREIGN PATENT DOCUMENTS

| DE | 10 2009 017 733 | 10/2010 |
| WO | 98/15005 | 4/1998 |

* cited by examiner

*Primary Examiner* — Alonzo Chambliss
(74) *Attorney, Agent, or Firm* — Dicke, Billig & Czaja, PLLC

(57) ABSTRACT

A semiconductor assembly is described. In accordance with one example of the invention, the semiconductor assembly comprises a semiconductor body, a top main electrode arranged on a top side, a bottom main electrode arranged on an underside, and a control electrode arranged on the top side. The semiconductor assembly further includes a spring element for the pressure contacting of the control electrode with a pressure force generated by the spring element.

19 Claims, 3 Drawing Sheets

SPRING CONTACT FOR SEMICONDUCTOR CHIP

CROSS REFERENCE TO RELATED APPLICATIONS

This Utility Patent Application claims priority to German Patent Application No. 10 2014 222 189.7, filed Oct. 30, 2014; and which is incorporated herein by reference.

BACKGROUND

The invention relates to the field of power semiconductor modules, their construction and manufacturing methods.

Semiconductor arrangements including press pack cells that are commercially available nowadays have a complex construction. Contacting of the individual terminals in the interior of the cell, for example emitter and collector, source and drain or anode and cathode, requires this complex construction. Therefore, it is necessary constantly to simplify the design of the cells and the production thereof in order to enable cost-effective and process-reliable production. Usually, the spring elements with which e.g. control electrode terminals (gate terminals in the case of IGBTs), are inserted into specific guides of the press pack housing and fixed in their position and orientation by subsequent insertion of the semiconductor chips under pressure. Such designs require separate insertion of the spring elements and entail an additional fault source and increased assembly costs.

One object on which the invention is based consists in providing and producing a power semiconductor module which is simple in terms of construction and allows facilitated assembly. Furthermore, an object consists in producing a semiconductor assembly of low construction.

BRIEF DESCRIPTION OF THE DRAWINGS

The invention is explained in greater detail below on the basis of the examples illustrated in the drawings. The illustrations are not necessarily true to scale and the invention is not just restricted to the aspects illustrated. Rather, importance is attached to illustrating the principles underlying the invention. In the drawings.

In the figures, identical reference signs designate identical or similar components having an identical or similar meaning in each case.

DETAILED DESCRIPTION OF THE DRAWINGS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

A semiconductor assembly is described. In accordance with one example of the invention, the semiconductor assembly includes a semiconductor body, wherein the semiconductor body has a top side and an underside opposite the top side, a top main electrode arranged on the top side, a bottom main electrode arranged on the underside, and a control electrode arranged on the top side, by means of which control electrode an electric current between the top main electrode and the bottom main electrode can be controlled. The semiconductor assembly furthermore comprises a spring element for the pressure contacting of the control electrode with a pressure force generated by the spring element, wherein the spring element is electrically and mechanically connected to the control electrode, such that the pressure force acts on the semiconductor assembly, inter alia.

Furthermore, a power semiconductor module is described. In accordance with one example of the invention, the power semiconductor module includes a housing frame and also a positioning frame arranged within the housing frame, and at least one semiconductor assembly, wherein the individual semiconductor assemblies are inserted into corresponding cutouts of the positioning frame. At least one circuit board is pressure-contacted by means of the spring element(s) of the semiconductor assembly(-ies). The power semiconductor module finally includes a top and a bottom stamp, which contact the top and bottom main electrodes and exert pressure on the spring elements.

Figure 1:
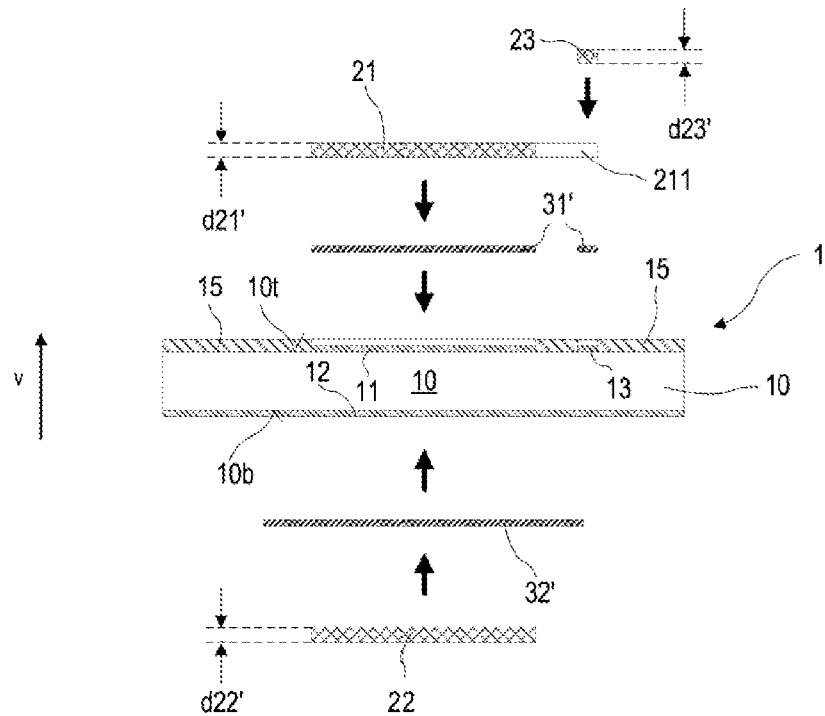
FIG. 1 illustrates a semiconductor chip with further parts for producing a semiconductor assembly.
Figure 2:
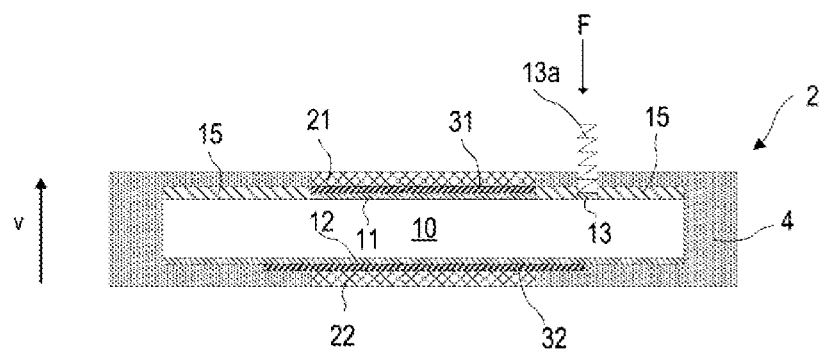
FIG. 2 illustrates a semiconductor assembly with fitted spring element in accordance with one example.

FIG. 1 illustrates one example of a semiconductor chip 1, and also further parts for producing a semiconductor assembly 2 such as is illustrated in FIG. 2. The semiconductor chip 1 illustrates a semiconductor body 10 composed of a basic semiconductor material (e.g. silicon), in which, in particular, p-conducting and n-conducting semiconductor zones are contained in order to realize a power semiconductor component integrated into the semiconductor body 10. Moreover, the semiconductor chip 1 can also have as many electrically conductive layers as desired such as, for example, metalizations, silicide layers or layers composed of doped polycrystalline semiconductor material (e.g. polycrystalline silicon), but also as many dielectric layers as desired such as, for example, nitride layers (e.g. silicon nitride), or oxide layers (e.g. silicon oxide), or passivation layers such as e.g. imide layers. The basic semiconductor material can be any known basic semiconductor material that is customary for producing semiconductor components, for example arbitrary elemental semiconductors (e.g. silicon, germanium) arbitrary compound semiconductors (e.g. II-VI semiconductors such as zinc selenide or cadmium sulfide, III-V semiconductors such as gallium phosphide, gallium nitride, gallium arsenide, indium phosphide, indium antimonide, or IV-IV semiconductors such as silicon carbide or silicon-germanium).

The semiconductor body 10 has a top side 10t, and also an underside 10b opposite the top side. The top side 10t is spaced apart from the underside 10b in a vertical direction v, wherein the vertical direction v runs perpendicularly to the underside 10b. A top main electrode 11 is arranged on the top side 10t, and a bottom main electrode 12 is arranged on the underside 10b. A control electrode 13 is likewise situated on the top side 10t. Furthermore, an optional top dielectric passivation layer 15 can be applied to the top side 10t. This passivation layer 15 can be a polyimide, for example.

The top main electrode 11, the bottom main electrode 12 and the control electrode 13 can be thin metalization layers, for example. Such metalization layers can be applied to the semiconductor body 10 for example as early as during the production of the semiconductor chip 1 in the wafer assemblage with further, identical semiconductor chips 1, that is to say before the wafer has yet been singulated to form mutually independent semiconductor chips 1.

As is illustrated in FIG. 2, an electrically conductive top compensation lamina 21 is situated on that side of the top main electrode 11 which faces away from the semiconductor body 10, said top compensation lamina being cohesively connected to the top main electrode 11 by means of a top connecting layer 31. Correspondingly, an electrically conductive bottom compensation lamina 22 is situated on that side of the bottom main electrode 12 which faces away from the semiconductor body 10, said bottom compensation lamina being cohesively connected to the bottom main electrode 12 by means of a bottom connecting layer 32. Optionally, an electrically conductive contact piece 23 can also be fitted on the control electrode 13 (also see FIG. 5), said contact piece being cohesively and electrically conductively connected to the control electrode 13 by means of the top connecting layer 31. The contact piece 23 can be connected to the control electrode 13. Alternatively, the contact piece can also be produced by depositing/growing material on the control electrode 13. If such a contact piece 23 is provided, the adjacent top compensation lamina 21 can have a cutout 211 (FIG. 1) in which the contact piece 23 is positioned later.

The compensation laminae 21 and 22 serve, in particular, to reduce mechanical stresses which occur if such a compensation lamina 21, 22 is subjected to pressure contact-connecting by a contact plate 41 and respectively 42 (e.g. composed of copper, see FIG. 7), which will be explained later, said contact plate having a coefficient of thermal expansion which is greatly different from the coefficient of thermal expansion of the semiconductor body 10. In the absence of compensation laminae 21, 22, the contact plates 41 and 42 would make contact directly with the very thin main electrodes 11 and 12, respectively. On account of the thermomechanical stresses arising here, the electrical properties of the semiconductor chip 1 can vary; in the worst case, the semiconductor chip 1 can also crack.

The compensation laminae 21 and 22 and—if present—the contact piece 23 have relatively large thicknesses d21', d22' and d23', respectively, in the vertical direction v, for example at least 0.5 mm, at least 1 mm, or at least 1.5 mm. The large thicknesses are intended to prevent damage to the electrodes 11, 12 and 13 if the compensation laminae 21 and 22 and, if appropriate, the contact piece 23, as will be explained later, are ground.

Optionally, the top compensation lamina 21 and/or bottom compensation lamina 22 can have a coefficient of linear thermal expansion that is significantly lower than the coefficient of linear thermal expansion of the top main electrode 11 and the bottom main electrode 12, in order to achieve an adaptation of the coefficient of linear thermal expansion to the low coefficient of linear thermal expansion of the semiconductor body 10. By way of example, the top compensation lamina 21 and/or the bottom compensation lamina 22, at a temperature of 20° C., can have a coefficient of linear thermal expansion of less than 11 ppm/K or even of less than 7 ppm/K. In this case, the top compensation lamina 21 and/or the bottom compensation lamina 22 can for example consist of one of the following materials or have one of the following constructions: molybdenum; a metal matrix composite material (MMC), for example AlSiC (aluminum silicon carbide); a multilayer material comprising two or more metal layers, for example a three-layer material having the layer sequence copper-molybdenum-copper (Cu—Mo—Cu), e.g. having layer thicknesses in the ratio of 1:4:1, which produces a coefficient of expansion of the Cu—Mo—Cu three-layer material of approximately 7.3 ppm/K.

The top connecting layer 31 can be embodied for example as an arbitrary solder layer, in particular also as a diffusion solder layer, as a sintered layer containing a sintered metal powder (e.g. silver powder or silver flakes), or as an electrically conductive adhesive layer. Independently thereof, the bottom connecting layer 32 can also be embodied as an arbitrary solder layer, in particular also as a diffusion solder layer, as a sintered layer containing a sintered metal powder (e.g. silver powder or silver flakes), or as an electrically conductive adhesive layer. The top connecting layer 31 and the bottom connecting layer 32 can consist of the same material, in particular; however, it is also possible to use arbitrary combinations of the materials mentioned for the two layers.

In FIG. 1, the starting materials used for producing the top connecting layer 31 and the bottom connecting layer 32 are designated by 31' and 32', respectively. This is intended to express the fact that the original connecting means 31' and 32' can be present in an altered form after the connection has been produced.

In the case of a starting material 31', 32' embodied as solder (for example a tin-containing solder), the resulting connecting layer 31 and 32, respectively, can contain a material (e.g. copper) which diffused into the solder from the top main electrode 11 and the bottom main electrode 12, respectively, during the connection process and thus constitutes a constituent of the finished connecting layer 31 and 32, respectively. In order to produce the connections, the solder 31', 32' can be applied in the form of a solder paste, for example, to the main electrodes 11, 12 and/or to the compensation laminae (for example by screen or stencil printing). Likewise, however, the solder 31', 32' can also be introduced in the form of a prefabricated solder lamina ("preform solder") respectively between the top compensation lamina 21 and the top main electrode 11 and between the bottom compensation lamina 22 and the bottom main electrode 12. In any case the solder paste or the solder lamina/laminae for producing the connections explained are melted and subsequently cooled, such that a cohesive connection in each case arises between the top compensation lamina 21 and the top main electrode 11 and respectively between the bottom compensation lamina 22 and the bottom main electrode 12.

In the case of a connecting layer 31 and 32, respectively, embodied as a sintered layer, the starting material 31' and 32', respectively, on which said layer is based can be embodied as a paste containing a metal powder (e.g. silver powder or silver flakes) and a solvent. In order to produce the connections, the paste can be applied, for example, to the main electrodes 11, 12 and/or to the compensation laminae 21, 22 (for example by screen or stencil printing). A paste layer formed from the paste is then arranged in each case between the top main electrode 11 and the top compensation lamina 21 and makes contact with each of them. Correspondingly, a further paste layer formed from the paste is arranged between the bottom main electrode 12 and the bottom compensation lamina 22 and makes contact with each of them. In this state, the paste layers are dried by evaporation of the solvent contained therein and are then sintered, wherein the sintering can be carried out at temperatures of significantly less than 250° C. As a result of the sintering, the (electrically conductive) top connecting layer 31 and respectively the (electrically conductive) bottom connecting layer 32 are formed from the two paste layers.

In the case of a connecting layer 31 and 32, respectively, embodied as an electrically conductive adhesive layer, the starting material 31' and 32', respectively, on which said layer is based is embodied as an electrically conductive adhesive. In order to produce the connections, the adhesive can be applied, for example, to the main electrodes 11, 12 and/or to the compensation laminae 21, 22 (for example by screen or stencil printing). A top adhesive layer formed from the adhesive is arranged between the top main electrode 11 and the top compensation lamina 21 and makes contact with each of them. As a result of the subsequent curing, the electrically conductive top connecting layer 31 is formed from the top adhesive layer. Correspondingly, a bottom adhesive layer formed from an adhesive is arranged between the bottom main electrode 12 and the bottom compensation lamina 22 and makes contact with each of them. As a result of the subsequent curing, the electrically conductive bottom connecting layer 32 is formed from the bottom adhesive layer.

If an optional contact piece 23 is provided, it can be cohesively connected to the control electrode 13 by means of any of the connecting techniques such as have already been explained for the connection between the top compensation lamina 21 and the top main electrode 11, to be precise independently of the connecting techniques chosen for the connection between the top compensation lamina 21 and the top main electrode 11.

The following FIGS. 2 to 6 illustrate different examples of the semiconductor assembly 2 in accordance with FIG. 1 in the assembled state, wherein the semiconductor body 10 including the electrodes 11, 12, 13, the compensation laminae 21 and 22 and the passivation layer 15 is at least partly surrounded by a plastics compound 4. The plastics compound 4 can be molded by means of various encapsulation methods, which are generally often referred to as "molding" (e.g. injection molding, compression molding, or transfer molding). In this context, the plastics compound 4 is often also referred to as a molding compound. Appropriate materials for the plastics compound include both thermoplastics and thermosetting plastics, e.g. epoxy resins, polyimides, cyanate-based thermosetting plastics, silicones or benzoxazine resins. Such molding methods are known per se and will therefore not be explained in greater detail. In the present example, a multiplicity of semiconductor assemblies 2 can also be encapsulated in molding compound 4 all at once in a manner situated alongside one another, thus giving rise to an assemblage of semiconductor assemblies 2, which can subsequently be singulated again.

FIG. 2 illustrates one example of a semiconductor assembly 2 in accordance with FIG. 1 with an integrated spring element 13a, which is cohesively and electrically conductively connected to the control electrode 13. At the same time, the spring element 13a in the unloaded state projects at least partly from the molding compound 4 in the vertical direction v. In this case, the molding compound 4 (i.e. the housing formed from the molding compound) can generally be embodied such that the spring is guided in a cutout of the housing, such that a movement of the spring is guided only along one direction (generally along the vertical direction v, that is to say the direction normal to the chip surface). Generally, the spring element is embodied as a helical spring. The cohesive connection between the spring element 13a and the control electrode can be effected for example by means of soldering, adhesive bonding or ultrasonic welding (bonding). At that location at which the spring projects from the molding compound 4, a cutout is provided in the latter, into which cutout the spring element 13a can be inserted. The spring element 13a serves for the pressure contacting of the control electrode, wherein in the incorporated state (i.e. with active pressure contacting) a pressure force F generated by the spring element acts on the control electrode. In this case, the pressure force acts substantially in a direction normal to the surface of the control electrode 13.

Figure 3:
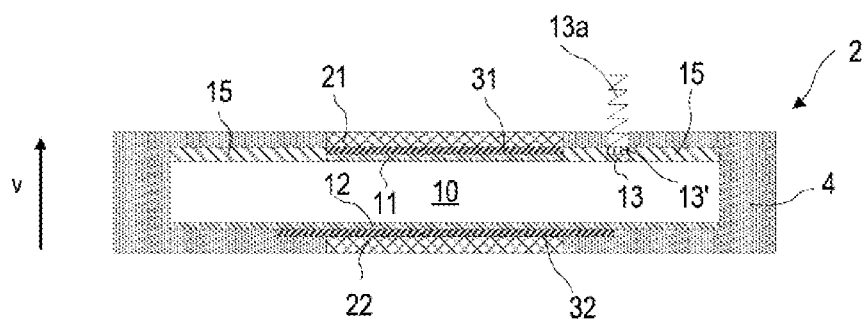
FIG. 3 illustrates a semiconductor assembly with fitted spring element and a spacer cylinder in accordance with a further example.

FIG. 3 illustrates a further example of a semiconductor assembly, which is constructed substantially identically to that in the previous example (FIG. 2), but comprises an integrated spacer cylinder 13' between control electrode 13 and spring element 13a, said spacer cylinder functioning as a protective element and protecting the gate electrode 13 from damage. The spacer cylinder 13' can be produced from molybdenum or from copper, for example, and is arranged directly above the control electrode 13 in the vertical direction and is at least partly cohesively connected to said control electrode. The spacer cylinder 13' can be formed from the same material as the compensation laminae 21, 22. Instead of a spacer cylinder 13', a lamina having a non-cylindrical shape can also be used.

Figure 4:
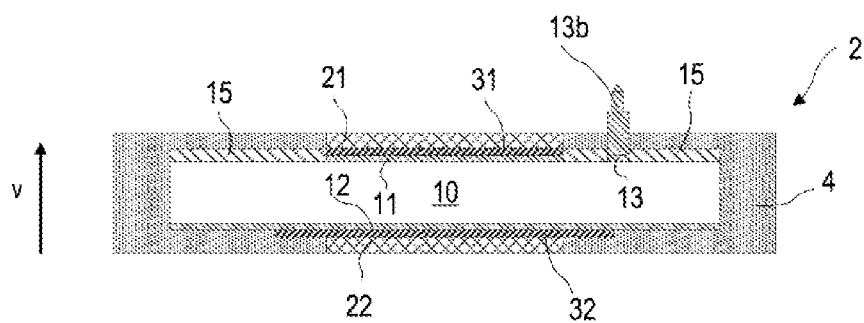
FIG. 4 illustrates a semiconductor assembly with fitted spring element in accordance with a further example.

FIG. 4 illustrates a further example of a semiconductor assembly 2. The example illustrated is substantially identical to the previous examples from FIGS. 2 and 3 with exception of the configuration of the spring element 13b. In the present example, the spring element 13b consists of an encapsulated spring arranged in the interior of two sleeve bodies and coaxially with respect thereto. In this case, the sleeve bodies are embodied in such a way that the sleeve having a smaller diameter can be pushed into the sleeve having a larger diameter counter to the spring force in an axial direction. The outer lateral surface of the sleeve having a smaller diameter can slide to the inner lateral surface of the sleeve having a larger diameter. The sleeve having a larger diameter (that is to say the outer sleeve) is at least partly cohesively and electrically conductively connected to the control electrode 13. The sleeve of the spring element 13b having a smaller diameter projects at least partly from the molding compound 4 in the unloaded state, in a manner similar to the helical spring in the example from FIG. 2. The sleeve of the spring element 13b having a larger diameter can likewise (but need not) project at least partly from the molding compound 4. A spacer cylinder 13'—in a manner similar to that in the example shown in FIG. 3—can lie between the control electrode 13 and the spring element 13b.

Figure 5:
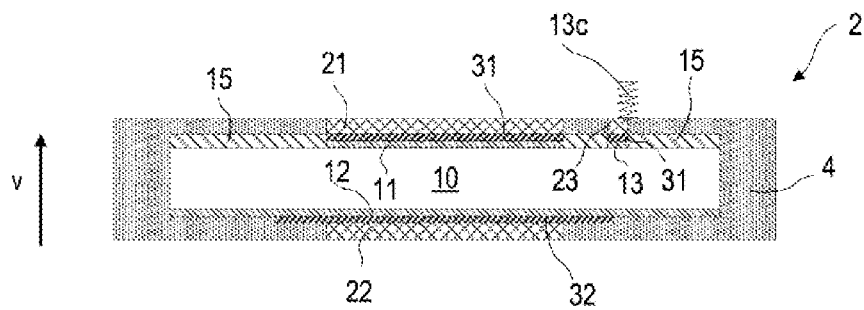
FIG. 5 illustrates a semiconductor assembly with fitted spring element in accordance with a further example.

FIG. 5 illustrates a further example of a semiconductor assembly 2, wherein an optional contact piece 23 is provided between control electrode 13 and spring element 13c. Apart from the spring element 13c and the fixing thereof to the control electrode 13, this example is identical to those described above (FIGS. 2, 3 and 4). The contact piece 23 bridges the vertical distance between the control electrode 13 and the surface of the molding compound 4. The (vertical) thickness of the contact piece 23 can be substantially equal to the thickness of the compensation laminae 21, 22 arranged at the main electrodes 11 and 12. At the side, the upper side, of the contact piece 23 facing away from the semiconductor chip 10, a helical spring 13c is fitted as spring element, said helical spring at least partly projecting from the molding compound 4. In the present example, the contact piece 23 does not project beyond the molding compound 4. The spring element 13c is at least partly cohesively and electrically conductively connected to the molding compound 4 or the contact piece 23. The spring element 13c is electrically connected to the control electrode 13 via the contact piece 23. A connecting layer 31, for example a solder layer or an adhesive layer, can be provided between contact piece 23 and control electrode 13.

Figure 6:
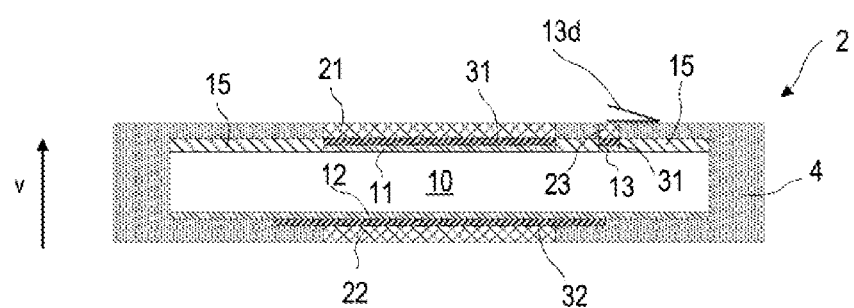
FIG. 6 illustrates a semiconductor assembly with fitted spring element in accordance with a further example.

The example of a semiconductor assembly 2 as illustrated in FIG. 6 differs from the previous example from FIG. 5 merely in the design of the spring. A leg spring 13d is fitted at that side of the contact piece 23 which faces away from the semiconductor chip. A leg of the spring 13d is fixed to the contact piece 23, for example by means of soldering or ultrasonic welding. In the example illustrated, the contact piece 23 does not project beyond the molding compound 4 and terminates in a planar fashion with the surface of the molding compound 4. In this case, the leg of the leg spring 13d facing the contact piece 23 bears in a planar fashion at least partly on the contact piece 23 and/or the molding compound 4. The leg spring 13d is embodied as a spring plate bent away, at an acute angle.

The semiconductor assemblies 2 with spring element 13a, 13b, 13c, or 13d arranged fixedly thereon, as illustrated in FIGS. 2 to 6, can be incorporated into a so-called press pack housing in a simple manner. Usually, two or more semiconductor assemblies are arranged in a press pack housing. In this case, the individual semiconductor assemblies are electrically connected in parallel.

Figure 7:
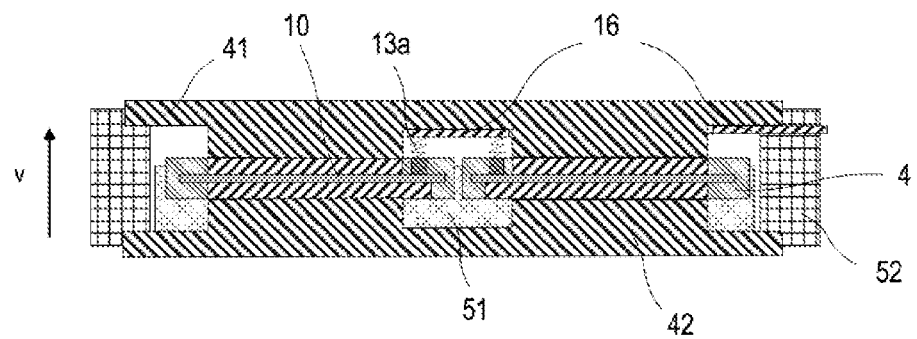
FIG. 7 illustrates one example of a module comprising two semiconductor assemblies in a press pack housing.

In the case of the example illustrated in FIG. 7, there are two semiconductor assemblies 2 in a press pack housing. In this case, the housing comprises a positioning frame 51, into which the semiconductor assemblies 2 are inserted alongside one another. The spring elements (13a, 13b, 13c, or 13d, depending on the embodiment of the semiconductor assemblies) of the individual semiconductor assemblies 2 form a pressure contact between an auxiliary circuit board 16 and the respective semiconductor assembly. The auxiliary circuit board 16 is arranged at a side of a top copper stamp 41 facing the spring elements 13a, 13b, 13c, 13d in a vertical direction v. In addition, the semiconductor assemblies are electrically conductively connected to the top copper stamp 41 and a bottom copper stamp 42. The top copper stamp 41 contacts the top compensation lamina 21 and bears against the latter at least partly in a planar fashion. The bottom copper stamp 42 contacts the bottom compensation lamina 22 and likewise bears against the latter at least partly in a planar fashion. The arrangement is spatially delimited from the surroundings by a housing wall 52 (housing frame). The copper stamps 41, 42 thus form base and cover of the housing that is laterally bounded by the housing frame 52.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor assembly comprising:
    a semiconductor body having a top side and an underside opposite the top side;
    a top main electrode arranged on the top side;
    a bottom main electrode arranged on the underside;
    a control electrode arranged at the top side, by means of which control electrode an electric current between the top main electrode and the bottom main electrode can be controlled;
    a spring element that pressure contacts the control electrode with a pressure force generated by the spring element, wherein the spring element is electrically and mechanically connected to the control electrode, such that the pressure force acts on the semiconductor assembly, inter alia; and
    a body composed of molding compound in which the semiconductor body is embedded.

2. The semiconductor assembly as claimed in claim 1, wherein the pressure force acts on the semiconductor body directly or indirectly.

3. The semiconductor assembly as claimed in claim 1, wherein the pressure force acts on the control electrode directly or indirectly.

4. The semiconductor assembly as claimed in claim 1, wherein the spring element is directly and cohesively connected to the control electrode.

5. The semiconductor assembly as claimed in claim 1, wherein the spring element is embodied as a helical spring.

6. The semiconductor assembly as claimed in claim 1, wherein the spring element has two sleeves, in which a spring is situated, wherein the sleeves slide one in the other, and wherein the outer lateral surface of the sleeve having a smaller diameter slides axially on the inner lateral surface of the sleeve having a larger diameter.

7. The semiconductor assembly as claimed in claim 1, wherein the spring element is mechanically and electrically conductively connected to the control electrode via a contact piece.

8. The semiconductor assembly as claimed in claim 7, wherein the contact piece is arranged in a cutout in the molding compound.

9. The semiconductor assembly as claimed of claim 1, wherein the spring element is embodied as a leg spring.

10. A power semiconductor module comprising the following:
    a housing frame,
    a positioning frame arranged within the housing frame,
    at least one semiconductor assembly as claimed in claim 1, wherein the individual semiconductor assemblies are inserted into corresponding cutouts of the positioning frame,
    at least one circuit board pressure-contacted with the semiconductor assembly(ies) via spring element(s) thereof,
    a top and a bottom stamp, which contact the top and bottom main electrodes and exert pressure on the spring elements.

11. The power semiconductor module, as claimed in claim 10, wherein the spring element(s) pressure-contacts/pressure-contact the at least one circuit board without being cohesively connected thereto.

12. A semiconductor assembly comprising:
a semiconductor body having a top side and an underside opposite the top side;
a top main electrode arranged on the top side;
a bottom main electrode arranged on the underside;
a control electrode arranged at the top side, by means of which control electrode an electric current between the top main electrode and the bottom main electrode can be controlled;
a spring element that pressure contacts the control electrode with a pressure force generated by the spring element, wherein the spring element is electrically and mechanically connected to the control electrode, such that the pressure force acts on the semiconductor assembly, inter alia; and
an electrically conductive top compensation lamina, which is arranged on that side of the top main electrode which faces away from the semiconductor body, and is cohesively and electrically conductively connected to the top main electrode by a top connecting layer.

13. A semiconductor assembly comprising:
a semiconductor body having a top side and an underside opposite the top side;
a top main electrode arranged on the top side;
a bottom main electrode arranged on the underside;
a control electrode arranged at the top side, by means of which control electrode an electric current between the top main electrode and the bottom main electrode can be controlled;
a spring element that pressure contacts the control electrode with a pressure force generated by the spring element, wherein the spring element is electrically and mechanically connected to the control electrode, such that the pressure force acts on the semiconductor assembly, inter alia; and
a bottom compensation lamina, which is arranged on that side of the bottom main electrode which faces away from the semiconductor body, and is cohesively and electrically conductively connected to the bottom main electrode by a bottom connecting layer.

14. A semiconductor assembly comprising:
a semiconductor body having a top side and an underside opposite the top side;
a top main electrode arranged on the top side;
a bottom main electrode arranged on the underside;
a control electrode arranged at the top side, by means of which control electrode an electric current between the top main electrode and the bottom main electrode can be controlled;
a spring element that pressure contacts the control electrode with a pressure force generated by the spring element, wherein the spring element is electrically and mechanically connected to the control electrode, such that the pressure force acts on the semiconductor assembly, inter alia;
an electrically conductive top compensation lamina connected to the top main electrode by a top connecting layer; and
a bottom compensation lamina connected to the bottom main electrode by a bottom connecting layer.

15. The semiconductor assembly as claimed in claim 14, wherein the spring element is directly and cohesively connected to the control electrode.

16. The semiconductor assembly as claimed in claim 14, wherein the spring element has two sleeves, in which a spring is situated, wherein the sleeves slide one in the other, and wherein the outer lateral surface of the sleeve having a smaller diameter slides axially on the inner lateral surface of the sleeve having a larger diameter.

17. The semiconductor assembly as claimed in claim 14, wherein the spring element is mechanically and electrically conductively connected to the control electrode via a contact piece.

18. The semiconductor assembly as claimed in claim 17, which furthermore comprises a body composed of molding compound, into which the semiconductor body is embedded, wherein the contact piece is arranged in a cutout in the molding compound.

19. The semiconductor assembly as claimed in claim 14, which furthermore comprises a body composed of molding compound, into which the semiconductor body is embedded.

* * * * *